United States Patent
Hyatt

(10) Patent No.: US 7,870,410 B2
(45) Date of Patent: Jan. 11, 2011

(54) AUTOMATIC REDUCED AUDIO LOW BATTERY WARNING

(75) Inventor: Edward C. Hyatt, Durham, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 633 days.

(21) Appl. No.: 11/939,083

(22) Filed: Nov. 13, 2007

(65) Prior Publication Data

US 2009/0125745 A1 May 14, 2009

(51) Int. Cl.
*G06F 1/00* (2006.01)
(52) U.S. Cl. ...................... 713/340; 713/300
(58) Field of Classification Search ............... 713/300, 713/340
See application file for complete search history.

(56) References Cited

U.S. PATENT DOCUMENTS

| | | | |
|---|---|---|---|
| 4,660,027 A | 4/1987 | Davis | |
| 4,755,816 A | 7/1988 | Deluca | |
| 5,151,680 A | 9/1992 | Yamasaki | |
| 5,268,845 A * | 12/1993 | Startup et al. | 323/275 |
| 5,304,986 A | 4/1994 | Motegi | |
| 6,133,709 A * | 10/2000 | Puchianu | 320/116 |
| 6,282,662 B1 * | 8/2001 | Zeller et al. | 713/300 |
| 6,339,742 B2 * | 1/2002 | Weisman, II | 701/114 |
| 6,697,953 B1 * | 2/2004 | Collins | 713/320 |
| 7,009,621 B1 * | 3/2006 | Tong | 345/589 |
| 7,711,132 B2 * | 5/2010 | Kufner et al. | 381/312 |
| 2002/0159613 A1 * | 10/2002 | Killion | 381/323 |
| 2003/0117261 A1 * | 6/2003 | Gunsch | 340/5.25 |
| 2006/0043933 A1 * | 3/2006 | Latinis | 320/132 |
| 2007/0011473 A1 * | 1/2007 | Sung | 713/300 |
| 2008/0126930 A1 * | 5/2008 | Scott | 715/702 |
| 2009/0218957 A1 * | 9/2009 | Kraft et al. | 315/291 |

FOREIGN PATENT DOCUMENTS

| | | |
|---|---|---|
| EP | 0529627 | 3/1993 |
| GB | 2332827 | 6/1999 |
| WO | 92/08214 | 5/1992 |

OTHER PUBLICATIONS

International Search Report, corresponding to International Patent Application No. PCT/US2008/072759, dated Nov. 19, 2008.
Written Opinion, corresponding to International Patent Application No. PCT/US2008/072759, dated Nov. 19, 2008.
International Preliminary Report on Patentability, corresponding to International Patent Application No. PCT/US2008/072759, dated Feb. 12, 2010.

* cited by examiner

*Primary Examiner*—Mark Connolly
(74) *Attorney, Agent, or Firm*—R. Brian Drozd; Moore & Van Allen PLLC

(57) ABSTRACT

A method and apparatus for a low battery life warning that includes detecting when a battery life of a battery in a device has fallen below a certain level, and generating a warning of a low battery life by decreasing an audio level output by the device to a percentage of an audio volume set on the device responsive to the battery life having fallen.

17 Claims, 6 Drawing Sheets

AUTOMATIC REDUCED AUDIO LOW BATTERY WARNING

BACKGROUND OF THE INVENTION

The present invention is related to low battery warnings, and more specifically to an automatic reduced audio low battery warning.

Currently, many electronic devices that are portable have a battery to supply power when not connected to another power source. Further, many of these devices, for example, cellular phones, personal digital assistants (PDAs), laptop computers, audio players, electronic game devices, etc, may not provide a notification that a battery life is about to end. Even those that may have an indication that a life of the battery is running out, these devices usually provide a visual display requiring a user of the device to monitor and look at the device to determine if the battery life is low and about to end. These factors contribute to frustration of users of the devices as these devices may suddenly cut off due to a life of the battery having expired without any warning to the user of the device.

BRIEF SUMMARY OF THE INVENTION

According to one aspect of the present invention, a device includes a speaker, a battery, and a processor, wherein the processor detects when a battery life of the battery has fallen below a certain level and generates a warning of a low battery life by decreasing an audio level output by the speaker to a percentage of an volume level set on the device responsive to the battery life having fallen.

According to another aspect of the present invention, a method for a low battery life warning that includes detecting when a battery life of a battery in a device has fallen below a certain level, and generating a warning of a low battery life by decreasing an audio level output by the device to a percentage of an audio volume set on the device responsive to the battery life having fallen.

According to a further aspect of the present invention, a computer program product comprising a computer useable medium having computer useable program code embodied therewith, the computer useable program code comprising computer useable program code configured to detect when a battery life of a battery in a device has fallen below a certain level, and computer useable program code configured to generate a warning of a low battery life by decreasing an audio level output by the device to a percentage of an audio volume set on the device responsive to the battery life having fallen.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION OF THE INVENTION

Figure 1:
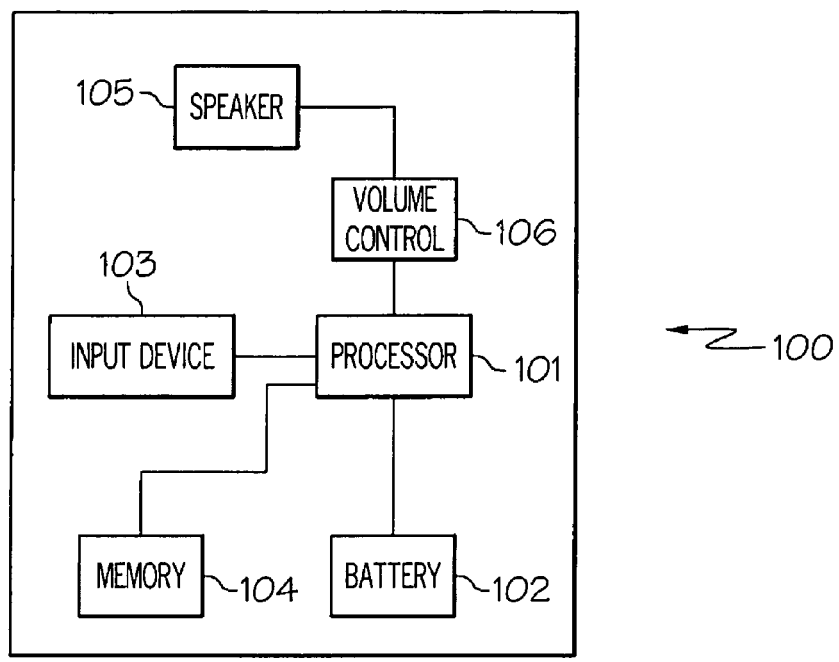
FIG. 1 is a diagram of a device that provides a reduced audio low battery warning according to an example embodiment of the present invention.

As will be appreciated by one of skill in the art, the present invention may be embodied as a method, system, computer program product, or a combination of the foregoing. Accordingly, the present invention may take the form of an entirely hardware embodiment, an entirely software embodiment (including firmware, resident software, micro-code, etc.) or an embodiment combining software and hardware aspects that may generally be referred to herein as a "system." Furthermore, the present invention may take the form of a computer program product on a computer-usable storage medium having computer-usable program code embodied in the medium.

Any suitable computer usable or computer readable medium may be utilized. The computer usable or computer readable medium may be, for example but not limited to, an electronic, magnetic, optical, electromagnetic, infrared, or semiconductor system, apparatus, device, or propagation medium. More specific examples (a non-exhaustive list) of the computer readable medium would include the following: an electrical connection having one or more wires; a tangible medium such as a portable computer diskette, a hard disk, a random access memory (RAM), a read-only memory (ROM), an erasable programmable read-only memory (EPROM or Flash memory), a compact disc read-only memory (CD-ROM), or other tangible optical or magnetic storage device; or transmission media such as those supporting the Internet or an intranet. Note that the computer usable or computer readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer usable or computer readable medium may be any medium that can contain, store, communicate, propagate, or transport the program for use by or in connection with the instruction execution system, platform, apparatus, or device. The computer usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, radio frequency (RF) or other means.

Computer program code for carrying out operations of the present invention may be written in an object oriented, scripted or unscripted programming language such as Java, Perl, Smalltalk, C++ or the like. However, the computer program code for carrying out operations of the present invention may also be written in conventional procedural programming languages, such as the "C" programming language or similar programming languages.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operations to be performed on the computer or other programmable apparatus to produce a computer implemented process such that the instructions which execute on the computer or other programmable apparatus provide steps for implementing the functions/acts specified in the flowchart and/or block diagram block or blocks. Alternatively, computer program implemented steps or acts may be combined with operator or human implemented steps or acts in order to carry out an embodiment of the invention.

According to embodiments of the present invention, a device that includes a speaker and a battery for power may provide a warning to a user of the device that a life of the battery is about to expire. A speaker may be any type of audio output device such as, for example, typical speaker, earphones, headset, wireless headset, wireless speaker, etc. The warning consists of reducing an audio level output from the speaker. The audio level output from the speaker may be reduced in any of many ways to a level that is a percentage of the current audio level being outputted based on a volume setting of the device. For example, the audio level output may be reduced, decreased, or faded in a continuous fashion, stepwise fashion, a linear fashion, a logarithmic fashion, etc. Reducing the audio level output not only conserves the battery life, but provides an indication to the user that the battery is getting low preventing the user being surprised by a sudden cutting off of the device.

Further, a user of the device need not monitor a battery life indicator on the device, but receives a warning indication by noticing the reduced audio level outputted from the device when a battery life has dropped below a specific level. For example, should a battery life fall below a certain percentage of capacity (e.g., 30%), the current audio level outputted by the device may be reduced by a certain percentage (e.g., 75%) of the currently outputted audio level. A user of the device may then choose to leave the audio level output from the device at the reduced level to conserve the battery life, or may choose to charge the battery to extend and revive the life of the battery.

FIG. 1 shows a diagram of a device that provides a reduced audio low battery warning according to an example embodiment of the present invention. The device 100 may include a processor 101, a battery 102, and input device 103, a memory 104, a speaker 105 and volume control logic 106 that allows a user of the device 100 to control and set a desired audio volume to be output from the speaker 105. The processor 101 may include circuits, software, or a combination thereof that monitors a life of the battery 102 and in response to the life falling below certain levels, reduces an audio level output from the speaker 105 of the device 100 accordingly from a current audio level being output from the speaker 105. For example, should a battery life of the battery 102 fall below a first level (e.g., 30% battery life left), the current audio level output from the speaker may be reduced to 75% of that output audio level, providing a warning to a user of the device that the life of the battery has fallen below a specific level.

Moreover, a user of the device 100 may use the input device 103 to enter and store desired parameters that the user desires regarding providing of the warning of a low battery life via the speaker output level. For example, the user may set up parameters that are stored in the memory 104 such that when a battery life is detected to be below a first level (e.g., 30%), a current audio level is reduced by a first percentage (e.g., 75%), and when the life of the battery level falls below a second level lower than the first level (e.g., 20%), an output audio level from the speaker 105 may be reduced by a second percentage (e.g., 50%) of a current audio level being output, and when the life of the battery level falls below a third level lower than the second level (e.g., 10%), an output audio level from the speaker 105 may be reduced by a third percentage (e.g., 25%) of a current audio level being output, etc. Further, a user may enter disable warning or override parameters where a user desires not to be warned or desires to have the ability to control the volume after a warning is given thereby overriding the current warning. Therefore, after a warning of a low battery life is given to a user, the user may use the volume control 106 to turn up or otherwise adjust the volume to produce a desired audio level output from speaker 105 thus overriding the warning.

Figure 2:
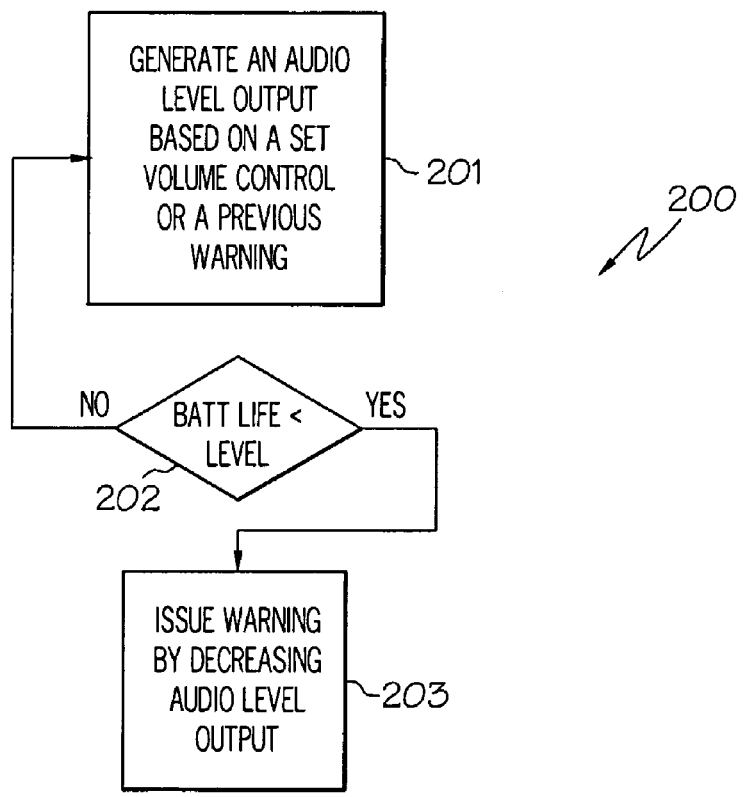
FIG. 2 is a flowchart of a process for an automatic reduced audio low battery warning according to an example embodiment of the present invention.

FIG. 2 shows a flowchart of a process for an automatic reduced audio low battery warning according to an example embodiment of the present invention. In the process 200, in block 201, an audio level output may be generated based on a set volume control or a previous low battery warning. In block 202, it may be determined if a current battery life has fallen below a particular level and if not, the process returns to block 201. If the battery life has fallen below a particular level, then in block 203, a warning of low battery life may be issued by decreasing an audio level being outputted.

Figure 3:
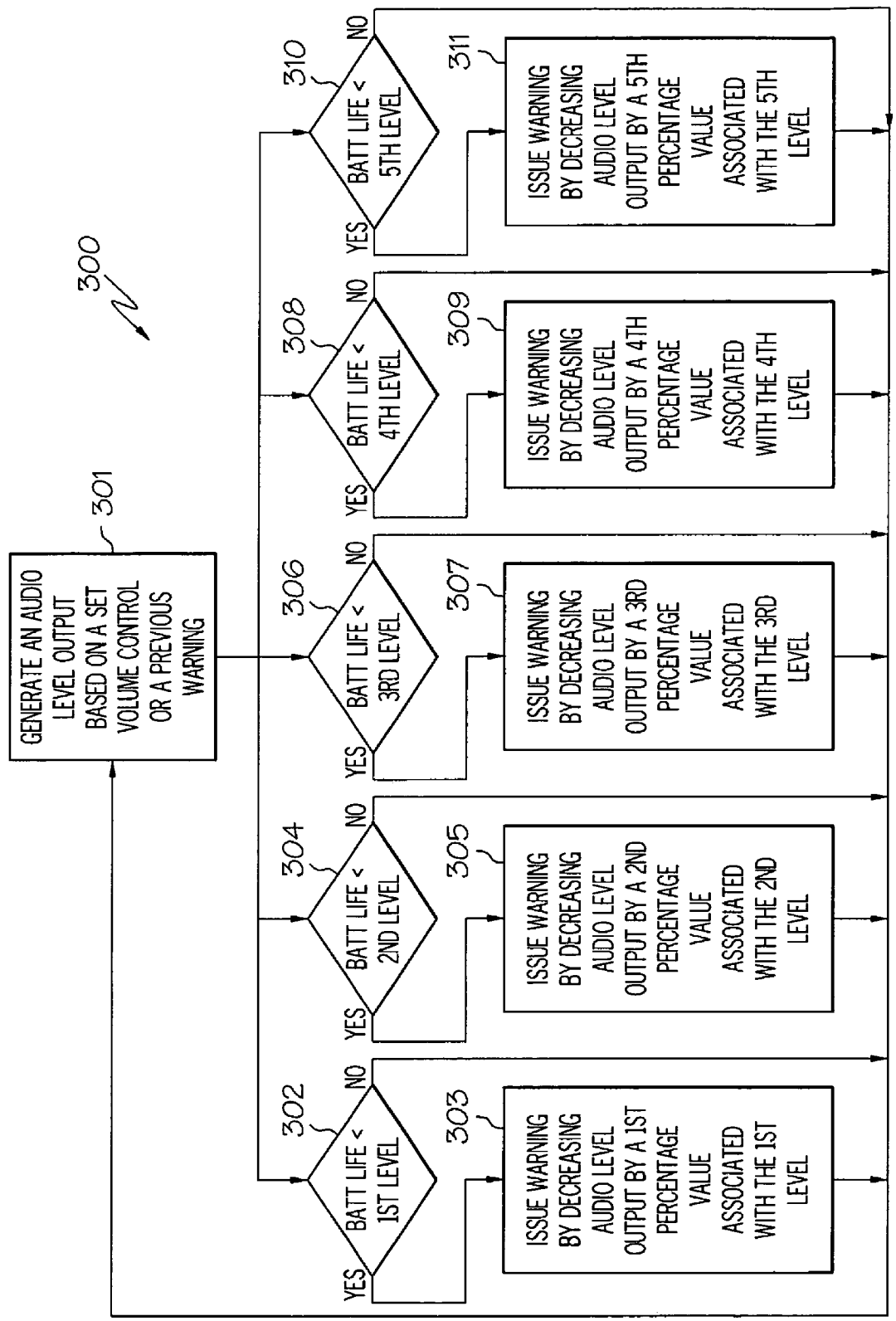
FIG. 3 is a flowchart of a process for decreasing an audio level output in accordance with decreased battery life according to an example embodiment of the present invention.

FIG. 3 shows a flowchart of a process for decreasing an audio level output in accordance with decreased battery life according to an example embodiment of the present invention. In the process 300, in block 301, an audio level output may be generated based on a audio volume level set by a volume control or a previous warning. In block 302, it may be determined if a battery life has been detected to be below a first level and if not, the process returns to block 301. If the battery life is determined to be below a first level, then in block 303, a warning may be issued by decreasing the audio level output by a first percentage value associated with the battery life first level. After the warning has been issued by reducing the audio level output, the process may return to block 301.

In block 304, it may be determined if the battery life has fallen below a second level. The battery life second level may be lower than the battery life first level. If the battery life has not fallen below the second level, the process may return to block 301. If the battery life has fallen below the second level, then in block 305, a warning may be issued by decreasing a current audio level being output by a second percentage value associated with the battery life second level. The second percentage may be a lower value than the first percentage. After the warning has been issued by reducing the audio level output, the process may return to block 301.

In block 306, it may be determined whether a battery life has fallen below a third level and if not, the process may return to block 301. The third level may be below the battery life second level. If the battery life has fallen below a third level, in block 307, a warning may be issued by decreasing a current audio level being output by a third percentage value associated with the battery life third level. The third percentage value may be lower than the second percentage value. After the warning has been issued by reducing the audio level output, the process may return to block 301.

In block 308, it may be determined if the current battery life is below a battery life fourth level and if not, the process may return to block 301. If the battery life is determined to be below the battery life fourth level, then in block 309, a warning may be issued by decreasing a current audio level being output by a fourth percentage value associated with the battery life fourth level. The battery life fourth level may be lower than the battery life third level. The fourth percentage value may be lower than the third percentage value. After the warning has been issued by reducing the audio level output, the process may return to block 301.

In block 310, it may be determined if the battery life is below a battery life fifth level and if not, the process may return to block 301. The battery life fifth level may be below the battery life fourth level. If the battery life is below the battery life fifth level, then in block 311, a warning may be issued by decreasing a current audio level being output by a fifth percentage value associated with the battery life fifth level. The fifth percentage value may be lower than the fourth percentage value. After the warning has been issued by reducing the audio level output, the process may return to block 301. This process may be repeated for other battery life levels, or only may include less battery life levels and still be within the scope of embodiments of the present invention.

Figure 4:
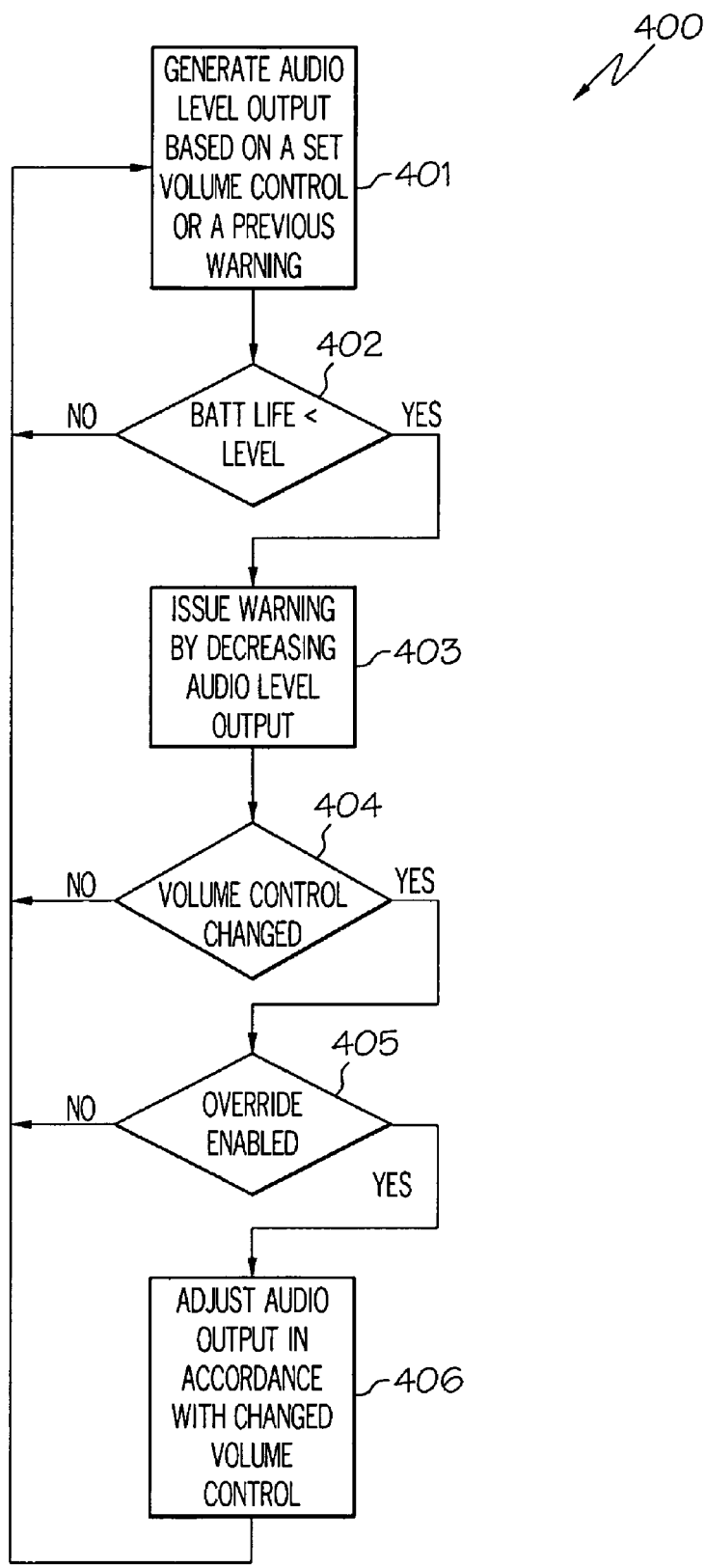
FIG. 4 is a flowchart of a process for overriding an automatic reduced audio low battery warning according to an example embodiment of the present invention.

FIG. 4 shows a flowchart of a process for overriding an automatic reduced audio low battery warning according to an example embodiment of the present invention. In the process 400, in block 401 an audio level output may be generated based on a set volume control or a previous warning. In block 402, it may be determined if the battery life is below a certain level and if not, the process may return to block 401. If the battery life is below a certain level, then in block 403, a warning may be issued by decreasing an audio level being outputted. In block 404, it may be determined if a volume control has been changed and if not, the process may return to block 401. If the volume control has been changed, in block 405 it may be determined if an override function is enabled and if not, the process may return to block 401. If an override has been enabled, then in block 406, the audio level output may be adjusted in accordance with the changed volume control and the process return to block 401. Therefore, according to embodiments of the present invention, if a user has set parameters to enable an override of the decreased audio warning, the user may then merely readjust the volume after the warning to override the warning and set the volume to a desired level of the user. The user may set parameters to allow overrides for all warnings, or may set parameters allowing only a certain number of overrides (e.g., 2) and then disabling future overrides.

Figure 5:
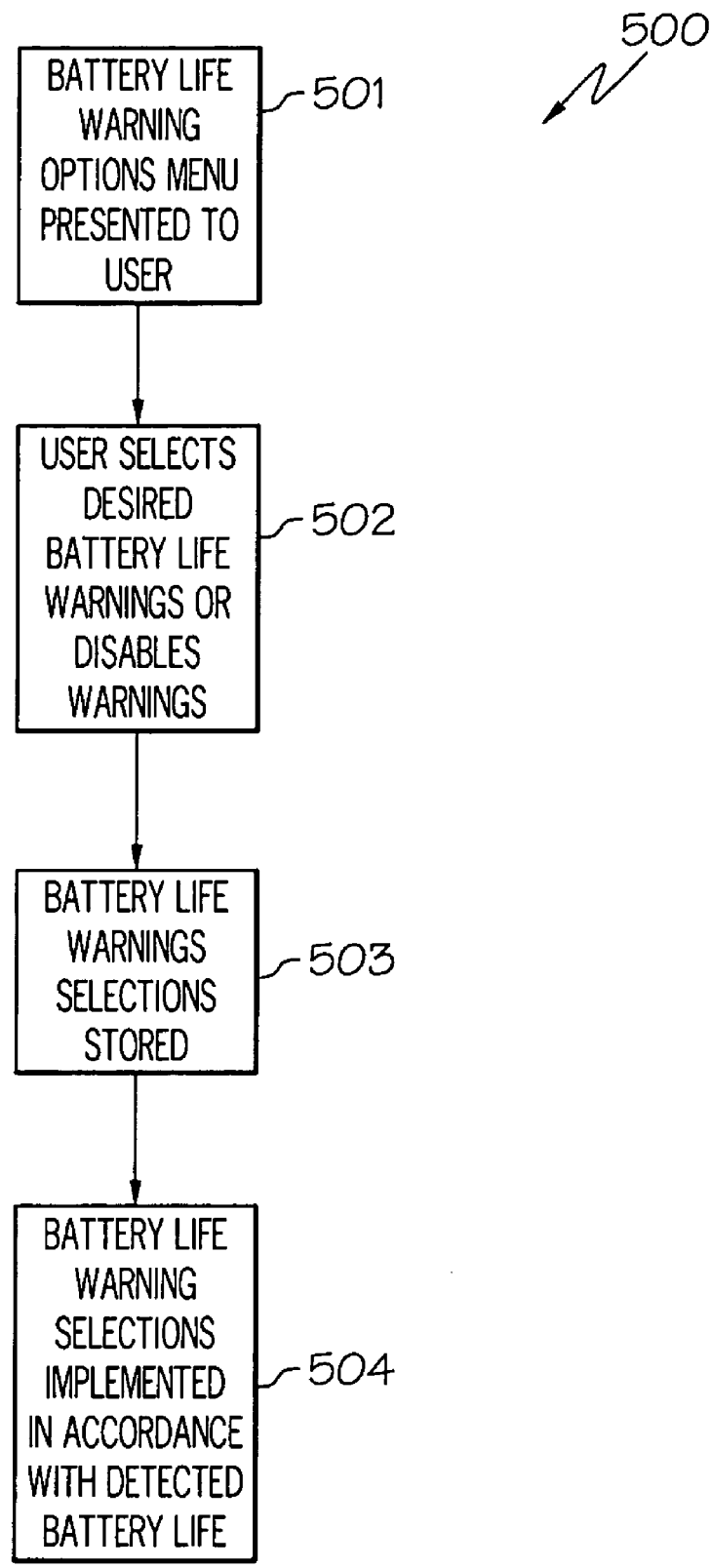
FIG. 5 is a flowchart of a process for setting automatic reduced audio low battery warning parameters according to an example embodiment of the present invention.

FIG. 5 shows a flowchart of a process for setting automatic reduced audio low battery warning parameters according to an example embodiment of the present invention. In the process 500, in block 501 a battery life warning options menu may be presented to a user. In block 502, the user may select desired battery life warnings or disable battery life warnings. In block 503, the battery life warning selections made by the user may be stored. In block 504, the battery life warning selections may be implemented in accordance with detection of a low battery life.

Figure 6:
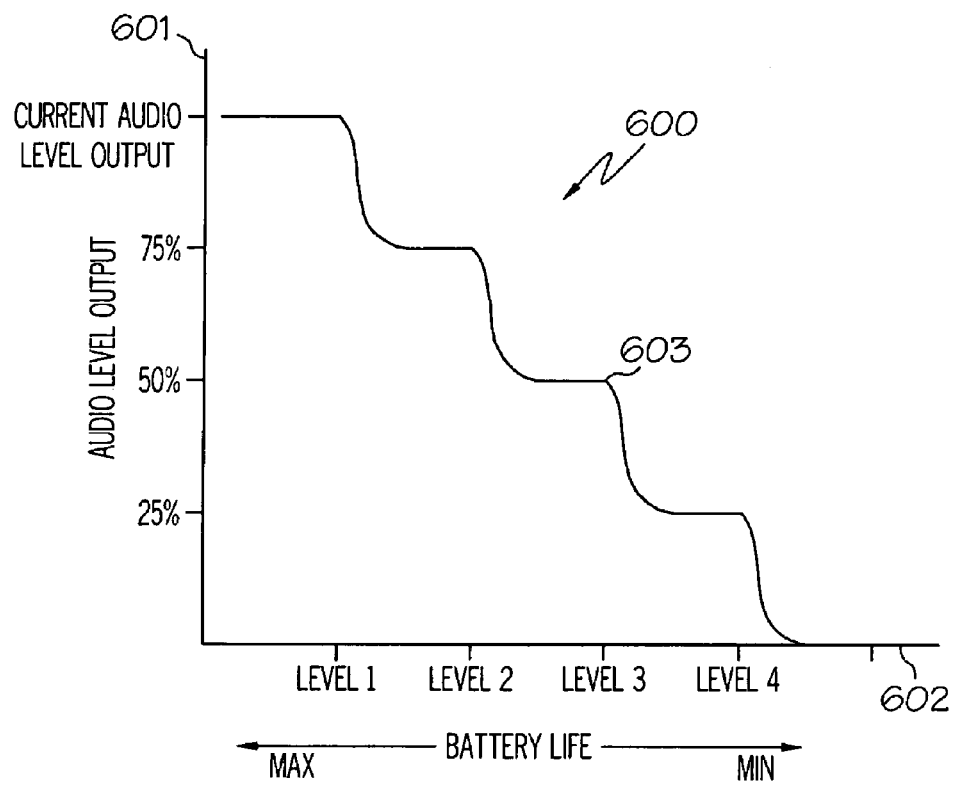
FIG. 6 is a diagram of a graph illustrating reducing an audio level in a continuous fashion according to an example embodiment of the present invention.

FIG. 6 shows a diagram of a graph illustrating reducing an audio level in a continuous fashion according to an example embodiment of the present invention. In this example embodiment, the graph 600 may include a vertical axis 601 representing a current audio level output and a horizontal axis 602 representing a current battery life level. The vertical axis 601 represents percentage values of the current audio level being outputted, and may start from a zero percentage and go to one hundred percent, which represents the current audio level being outputted. In this example embodiment, percentage values of 25%, 50% and 75% of the current audio level being outputted are shown on the vertical axis 601. Further, the horizontal axis 602 may represent a remaining battery life in terms of levels. Each level may represent a percentage value denoting the remaining battery life. The battery life horizontal axis 602 shows four different levels where a remaining battery life decreases from a left side of the horizontal axis 602 to the right. In this example embodiment, the curve 603 of the graph 600 assumes that at a maximum battery life a current audio level is being output. However, the curve 603 may be shifted to the right where a current audio level being outputted is actually occurring at, for example, a decreased battery life (e.g., level 1).

In this example embodiment, upon detecting that the battery life has fallen to a level one, the current audio level output may be faded continuously and decreased to 75% of the current audio level output and maintained at that level until it is detected that the battery life has fallen below a level 2 whereby the audio level output may be continuously reduced to 50% of the current audio level output. This process may repeat as the battery life is detected to have fallen below a level 3, a level 4, etc. Each level (i.e., levels 1-4) may represent a percentage of remaining battery life. For example, level 1 may represent 30% battery life remaining, level 2 may represent 20% battery life remaining, level 3 may represent 10% battery life remaining, level 4 may represent 5% battery life remaining, etc. Moreover, according to example embodiments of the present invention, other levels may also be included and be within the scope of the present invention. Further, the percentages of the current audio level output shown are only examples to illustrate the present invention and do not limit the present invention to these particular percentages as any percentage values may be used and still be within the scope of the present invention.

Figure 7:
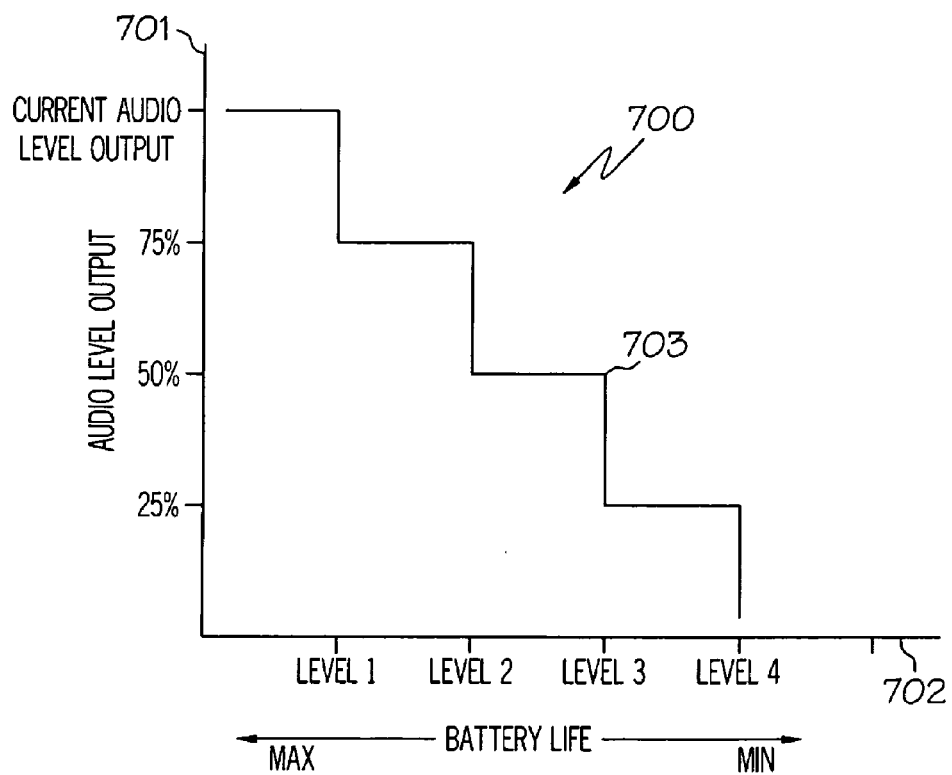
FIG. 7 is a diagram of a graph illustrating reducing an audio level in a step-wise fashion according to an example embodiment of the present invention.

FIG. 7 shows a diagram of a graph illustrating reducing an audio level in a step-wise fashion according to an example embodiment of the present invention. In this example embodiment, the graph 700 may include a vertical axis 701 representing a current audio level output and a horizontal axis 702 representing a current battery life level. The vertical axis 701 represents percentage values of the current audio level being outputted, and may start from a zero percentage and go to one hundred percent, which represents the current audio level being outputted. In this example embodiment, percentage values of 25%, 50% and 75% of the current audio level being outputted are shown on the vertical axis 701. Further, the horizontal axis 702 may represent a remaining battery life in terms of levels. Each level may represent a percentage value denoting the remaining battery life. The battery life horizontal axis 702 shows four different levels where a remaining battery life decreases from a left side of the horizontal axis 702 to the right. In this example embodiment, the curve 703 of the graph 700 assumes that at a maximum battery life a current audio level is being output. However, the curve 703 may be shifted to the right where a current audio level being outputted is actually occurring at, for example, a decreased battery life (e.g., level 1).

In this example embodiment, upon detecting that the battery life has fallen to a level one, the current audio level output may be faded in a step-wise fashion and decreased to 75% of the current audio level output and maintained at that level until it is detected that the battery life has fallen below a level 2 whereby the audio level output may be step-wise reduced to 50% of the current audio level output. This process may repeat as the battery life is detected to have fallen below a level 3, a level 4, etc. Each level (i.e., levels 1-4) may represent a percentage of remaining battery life. For example, level 1 may represent 30% battery life remaining, level 2 may represent 20% battery life remaining, level 3 may represent 10% battery life remaining, level 4 may represent 5% battery life remaining, etc. Moreover, according to example embodiments of the present invention, other levels may also be included and be within the scope of the present invention. Further, the percentages of the current audio level output shown are only examples to illustrate the present invention and do not limit the present invention to these particular percentages as any percentage values may be used and still be within the scope of the present invention.

Figure 8:
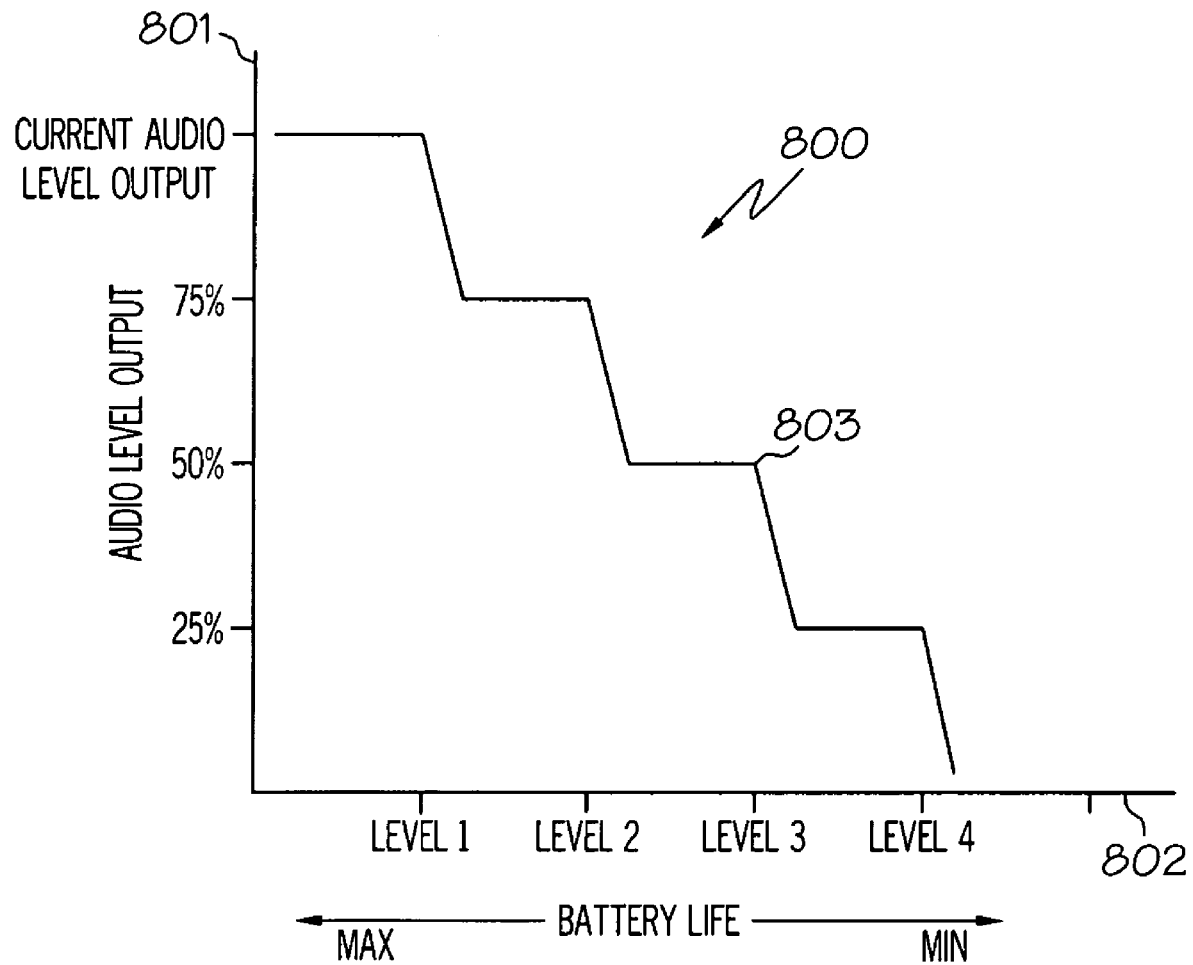
FIG. 8 is a diagram of a graph illustrating reducing an audio level in a linear fashion according to an example embodiment of the present invention.

FIG. 8 shows a diagram of a graph illustrating reducing an audio level in a linear fashion according to an example embodiment of the present invention. In this example embodiment, the graph 800 may include a vertical axis 801 representing a current audio level output and a horizontal axis 802 representing a current battery life level. The vertical axis 801 represents percentage values of the current audio level being outputted, and may start from a zero percentage and go to one hundred percent, which represents the current audio level being outputted. In this example embodiment, percentage values of 25%, 50% and 75% of the current audio level being outputted are shown on the vertical axis 801. Further, the horizontal axis 802 may represent a remaining battery life in terms of levels. Each level may represent a percentage value denoting the remaining battery life. The battery life horizontal axis 802 shows four different levels where a remaining battery life decreases from a left side of the horizontal axis 802 to the right. In this example embodiment, the curve 803 of the graph 800 assumes that at a maximum battery life a current audio level is being output. However, the curve 803 may be shifted to the right where a current audio level being outputted is actually occurring at, for example, a decreased battery life (e.g., level 1).

In this example embodiment, upon detecting that the battery life has fallen to a level one, the current audio level output may be faded continuously and decreased to 75% of the current audio level output and maintained at that level until it is detected that the battery life has fallen below a level 2 whereby the audio level output may be continuously reduced to 50% of the current audio level output. This process may repeat as the battery life is detected to have fallen below a level 3, a level 4, etc. Each level (i.e., levels 1-4) may represent a percentage of remaining battery life. For example, level 1 may represent 30% battery life remaining, level 2 may represent 20% battery life remaining, level 3 may represent 10% battery life remaining, level 4 may represent 5% battery life remaining, etc. Moreover, according to example embodiments of the present invention, other levels may also be included and be within the scope of the present invention. Further, the percentages of the current audio level output shown are only examples to illustrate the present invention and do not limit the present invention to these particular percentages as any percentage values may be used and still be within the scope of the present invention.

As mentioned above, the present invention provides systems and methods for reducing the audible output of the speaker based on an indication battery power. This aspect of the invention has the possible additive affect of reducing battery consumption as the battery begins to lose power.

The above embodiments describe systems and methods whereby a user may select the various audible levels to coincide with battery levels. In some embodiments, the systems and methods may use an internal program that presets audible levels based on battery level. In some instances, the chosen audible levels may be selected so as to minimize voltage drain from the battery and battery level decreases.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A device comprising:
   a speaker;
   a battery;
   a user interface configured to:
   allow a user to define a low battery life audio level as a percentage of a current volume level being outputted by the device such that when a level of battery life of the device has fallen below a predefined threshold level, the current volume level of the device will be adjusted to the user-defined percentage of the current volume level; and a processor configured to:
  detect when the battery life of the battery has fallen below the predefined threshold level, and
  in response to the battery life of the device falling below the predefined threshold level, generates a warning of a low battery life by adjusting an audio level output by the speaker to the preset percentage of the current volume level.

2. The device according to claim 1, wherein the speaker, battery user interface and processor are components of one of a mobile phone, a personal digital assistant (PDA), a portable audio device, a portable video device, a portable electronic game, or a wireless device.

3. The device according to claim 1, wherein the user interface is further configured to allow the user to set a second percentage of the volume level when the battery life is below a second level, the second level being lower than the threshold level, the second percentage being higher than the first percentage; and
  wherein the processor is further configured to decrease the audio level output to the second percentage of the current volume level set on the device when the battery life is below the user-set second level.

4. The device according to claim 1, wherein the processor is further configured for incrementally decreasing the audio level output in proportion to detected decreases in the battery life.

5. The device according to claim 4, wherein the processor is further configured for incrementally decreasing the audio level output in one of a step-wise fashion, linearly, continuously, or logarithmically in proportion to the detected decreases in the battery life.

6. The device according to claim 1, wherein the processor is further configured for sensing the battery life of the battery before the detecting when the battery life of the battery has fallen below the threshold level and after the device has been powered on and an audio volume is set on the device.

7. The device according to claim 1, wherein the processor is further configured for overriding the warning by changing the audio level output by the device when the set volume level on the device is changed after the warning.

8. The device according to claim 1, wherein the processor is further configured for setting warning parameters in the device responsive to input from a user of the device, the warning parameters comprising at least one of the percentage, a number of warnings, or override criteria.

9. The device according to claim 8, wherein the override criteria further comprises at least one of enable warning override, disable warning override, override warning when set volume level is changed, or ignore set volume changes after warning.

10. A method for a low battery life warning comprising:
  receiving from a user a definition of a low battery life audio level as a percentage of a current volume level being outputted by the device such that when a level of battery life of the device has fallen below a predefined threshold level, the current volume level of the device will be adjusted to the user-defined percentage of the current volume level;
  detecting when the battery life of a battery in a device has fallen below the predefined threshold level; and
  in response to the battery life of the device falling below the predefined threshold level, generating a warning of a low battery life by adjusting an audio level output by the device to the preset percentage of the current volume level.

11. The method according to claim 10, further comprising:
  allowing the user to set a second percentage of the volume level when the battery life is below a second level, the second level being lower than the threshold level, the second percentage being higher than the first percentage; and
  decreasing the audio level output to the second percentage of the current volume level set on the device when the battery life is below the user-set second level.

12. The method according to claim 10, further comprising incrementally decreasing the audio level output in proportion to detected decreases in the battery life.

13. The method according to claim 12, further comprising incrementally decreasing the audio level output in one of a step-wise fashion, linearly, continuously, or logarithmically in proportion to the detected decreases in the battery life.

14. The method according to claim 10, further comprising powering on the device, setting the audio volume on the device and sensing the battery life before the detecting if the battery life of the battery in the device has fallen below the threshold level.

15. The method according to claim 10, further comprising overriding the warning by changing the set volume level, the audio level output by the device changing responsive to the overriding.

16. The method according to claim 10, further comprising setting warning parameters in the device, the warning parameters comprising at least one of the percentage, a number of warnings, or override criteria.

17. The method according to claim 16, the override criteria further comprising at least one of enable warning override, disable warning override, override warning when set volume level is changed, or ignore set volume changes after warning.

* * * * *